US008586906B2

(12) United States Patent
Julien et al.

(10) Patent No.: US 8,586,906 B2
(45) Date of Patent: Nov. 19, 2013

(54) INTEGRATED CIRCUIT ARRAY HAVING COLUMN CONDUCTORS EACH ASSOCIATED WITH A RESPECTIVE BASIC READ CIRCUIT, AND IN PARTICULAR A LARGE-SIZED IMAGE SENSOR

(75) Inventors: Florian Julien, Voiron (FR); Xavier Montmayeur, Saint-Egreve (FR)

(73) Assignee: E2V Semiconductors, Saint-Égrève (FR)

( * ) Notice: Subject to any disclaimer, the term of this patent is extended or adjusted under 35 U.S.C. 154(b) by 206 days.

(21) Appl. No.: 13/133,326

(22) PCT Filed: Nov. 23, 2009

(86) PCT No.: PCT/EP2009/065606
§ 371 (c)(1),
(2), (4) Date: Aug. 22, 2011

(87) PCT Pub. No.: WO2010/066559
PCT Pub. Date: Jun. 17, 2010

(65) Prior Publication Data
US 2011/0290984 A1 Dec. 1, 2011

(30) Foreign Application Priority Data
Dec. 12, 2008 (FR) .................................. 08 07004

(51) Int. Cl.
*H01J 40/14* (2006.01)
(52) U.S. Cl.
USPC .................................... 250/214 R; 250/208.1
(58) Field of Classification Search
USPC .................. 250/214 R, 208.1; 327/514, 565;
257/209, 146, 751–761; 348/301–311,
348/222, 281
See application file for complete search history.

(56) References Cited

U.S. PATENT DOCUMENTS 6,642,495 B2 * 11/2003 Lowrance et al. ......... 250/208.1
2006/0243885 A1 11/2006 Watanabe

FOREIGN PATENT DOCUMENTS

| EP | 0 527 563 | 2/1993 |
| EP | 0 763 302 | 3/1997 |
| EP | 0 967 795 | 12/1999 |
| EP | 1 473 926 | 11/2004 |

OTHER PUBLICATIONS

International Search Report and Written Opinion from corresponding application No. PCT/EP2009/065606.

* cited by examiner

*Primary Examiner* — Que T Le
(74) *Attorney, Agent, or Firm* — Lowe Hauptman & Ham, LLP

(57) ABSTRACT

The invention relates notably to large-sized image sensors or image sensors with a large number of rows. Each column of pixels is organized in P superposed blocks. A row decoder organized as P identical decoders selects one row out of M in each of the P blocks. Each block is linked to one respective column conductor out of P column conductors. P read circuits $CL_1$ to $CL_4$ are placed at the foot of each column of pixels and each is connected to a respective column conductor. The signals from the P rows selected by the decoder can be extracted simultaneously or else they can be selected by a specific decoder which selects one read circuit out of the P read circuits of each column. The matrix can be produced by photolithography, by abutting identical matrix portions, for example P different portions corresponding to P identical regions $ZB_1$ to $ZB_4$.

20 Claims, 2 Drawing Sheets

INTEGRATED CIRCUIT ARRAY HAVING COLUMN CONDUCTORS EACH ASSOCIATED WITH A RESPECTIVE BASIC READ CIRCUIT, AND IN PARTICULAR A LARGE-SIZED IMAGE SENSOR

CROSS-REFERENCE TO RELATED APPLICATIONS

The present Application is based on International Application No. PCT/EP2009/065606, filed Nov. 23, 2009, which in turn corresponds to French Application No. 0807004, filed on Dec. 12, 2008, and priority is hereby claimed under 35 USC §119 based on these applications. Each of these applications are hereby incorporated by reference in their entirety into the present application.

FIELD OF THE INVENTION

The invention relates to large-sized integrated circuits organized as a matrix of basic circuits requiring for their operation an individual addressing of each basic circuit.

Large capacity memories fall within this definition, the basic circuits being individual memory points; large-sized electronic image sensors (with sides measuring several centimeters) also fall within this definition, the basic circuits being the pixels supplying a signal representing the lighting of a basic image point; matrix displays may also be included. Hereinafter, the invention will be described mainly with regard to image sensors which comprise a matrix of pixels organized in rows and columns.

BACKGROUND OF THE INVENTION

When the number of rows of the image sensors and their size increases, it is essential to pay particular attention to the organization of the matrix of pixels which allows for this increase in the number of rows or size.

In a conventional configuration for a moderate-sized matrix with moderate resolution, the organization is very simple: the matrix comprises X rows and Y columns and there is a row decoder making it possible to select one row out of X and a column decoder making it possible to select one column out of Y.

However, when the number of rows increases, it may be necessary to change the organization in order to more rapidly read all the pixels of the matrix. One solution consists, for example, in reading the matrix simultaneously from the top and from the bottom.

Also, when the size of the sensor increases, a limitation is imposed by the photolithography techniques which do not make it possible in practice to expose all at once the entire surface of the matrix and rather require a piecemeal exposure according to the so-called "stitching" technique consisting, during a photolithography step, in successively exposing several contiguous parts of the integrated circuit. However, an exposure of the surface by "stitching" may pose problems for the production of the row decoding circuits.

The present invention starts from these two issues to provide a solution thereto, but it should be understood that the solution can be implemented to address either the first issue or the second, or both together. We will start from the "stitching" photolithography issue to explain the invention.

In this type of photolithography, suited to chips measuring several square centimeters, it is possible to use several different masks to successively expose, during a photolithography step, several regions of the chip, each with its own pattern, until the entire surface of the chip followed by the adjacent chips on the same wafer are exposed. However, it is also possible, advantageously, to use a single mask to expose several regions of the chip when these regions are strictly identical. This is well suited to the production of the matrix of pixels. The matrix can be considered as a juxtaposition of several identical blocks each comprising a certain number of rows. A mask is defined for a single block, and this mask can be moved over the surface to be exposed as many times as there are blocks.

However, there is a difficulty: if a block includes not only rows of pixels but also the decoding elements that make it possible to address these rows, the blocks cannot all be identical. In practice, the decoder part for one block is not strictly identical to the decoder part for another block. The differences are very small but they do exist.

It would therefore be necessary in principle to expose the row decoder separately from the matrix, which necessitates an additional fabrication step; the matrix would be exposed in successive blocks, whereas the row decoder would use a different specific mask. This specific mask would also have to be of large size because the row decoder occupies the entire height of the matrix.

It is also possible to artificially make all the blocks of the matrix of pixels identical, by making the construction of each pixel more complex: a pixel generally comprises a row selection transistor controlled by a row conductor associated with a determined row of pixels, this row conductor being linked to the row decoder; if the matrix is organized in strictly identical blocks, it is then possible to provide for each pixel to comprise an additional block selection transistor, linked to another row conductor originating from the row decoder. A row of pixels would be controlled in read mode only if the two row conductors are activated. It is then possible to have strictly identical blocks, including identical row decoder blocks. However, then the decoding is more complex and, above all, each pixel is more complex.

SUMMARY OF THE INVENTION

The invention proposes another organizational solution in which the matrix may be composed of several blocks, all identical, each block including both rows of pixels and the row decoder portion associated with these rows. This invention is also a solution to the problem of accelerating the reading of the pixels of a matrix with a large number of rows. It is generally applicable to matrix circuits which are not necessarily image sensors, but it is particularly advantageous for image sensors.

According to the invention, there is proposed an integrated circuit comprising a set of basic circuits, all identical, arranged in X rows and Y columns, each row of basic circuits being addressed by a row conductor linked to a row decoder, characterized in that each column of basic circuits is subdivided into P blocks (P being greater than 2) of basic circuits, and in that there are provided, for each column, P juxtaposed basic read circuits, placed at one and the same end of this column and each associated with a respective block, and P column conductors each associated with a respective basic read circuit and a respective block, a column conductor being linked to the associated basic read circuit and to all the basic circuits of the associated block but not to the basic circuits of the other blocks.

The blocks of rows are juxtaposed between the top and the bottom of the matrix. They are in principle all identical but it is also possible to envisage the bottom block and/or the top block being different, in terms of number of rows.

Provision is preferably made for each of the P blocks to comprise P conductor sections extending between the top and the bottom of the block, the geometrical arrangement of the conductor sections of a block being identical to that of the other blocks, each column conductor comprising P conductor sections which are placed end-to-end and which are each taken in a respective block. The conductor sections are linked to the basic circuits which belong to the relevant block (and therefore to a relevant column).

The P conductor sections of a block are preferably arranged on two different metallization levels, P-1 sections being produced on one of the levels and a last section using the second level to intersect the P-1 first sections.

If we consider a block comprising P conductor sections, it is possible to provide for a particular arrangement of these sections: the P conductor sections of a block, juxtaposed and arranged in a rank from 1 to P, each comprise a bottom end and a top end arranged so that the bottom end of a section of a given rank situated in a first block comes into contact with the top end of a section of another rank situated in a second block placed above the first. The connection is preferably made according to a circular permutation of the ranks of the sections, a section of a first rank of a first block coming into contact with a section of a second rank of the other block, and so on.

The invention is particularly advantageously applicable to a matrix image sensor, in which the basic circuits arranged in rows and columns are photosensitive pixels, and notably active pixels comprising transistors.

Consequently, to sum up, it will be understood that a column of basic circuits is broken down (but with all the columns being processed in the same way) into P blocks and there are as many basic read circuits per column as there are blocks in the height of the matrix. The basic read circuits in a column can be selected by a specific decoder if the aim is to access the information of a single pixel situated at the intersection of a row (addressed by a row decoder) and a column; if the sensor is made by photorepetition of identical blocks, this specific decoder does not form part of the pattern of photorepeated blocks, whereas the row decoder of the matrix forms part of the pattern of photorepeated blocks and therefore simultaneously addresses P rows when it receives an address.

This architecture can be used independently of the pattern photorepetition issues. It is in fact of particular advantage in allowing for a very rapid read in the case of matrices with a large number of rows; in fact, provision can then be made for the P basic read circuits placed at the foot of a column to supply output signals simultaneously, that is to say that it is possible to read P simultaneous information items, deriving from P different rows addressed simultaneously by the row decoder; in a standard matrix organization, only a single information item, deriving from a single row, would be read. In the configuration according to the invention in which P signals are extracted from the matrix at a time, there is no specific decoder (or else it is not used) to select one basic read circuit out of P, but the signals are output from the entire matrix P times faster than if there were only a single basic read circuit for each column.

BRIEF DESCRIPTION OF THE DRAWINGS

Other features and advantages of the invention will become apparent from reading the following detailed description which is given with reference to the appended drawings in which.

DESCRIPTION OF PREFERRED EMBODIMENTS

The invention will be described with regard to a particularly interesting example which is a large-sized matrix image sensor (sides measuring several centimeters) comprising several hundred rows and several hundred columns of pixels.

Figure 1:
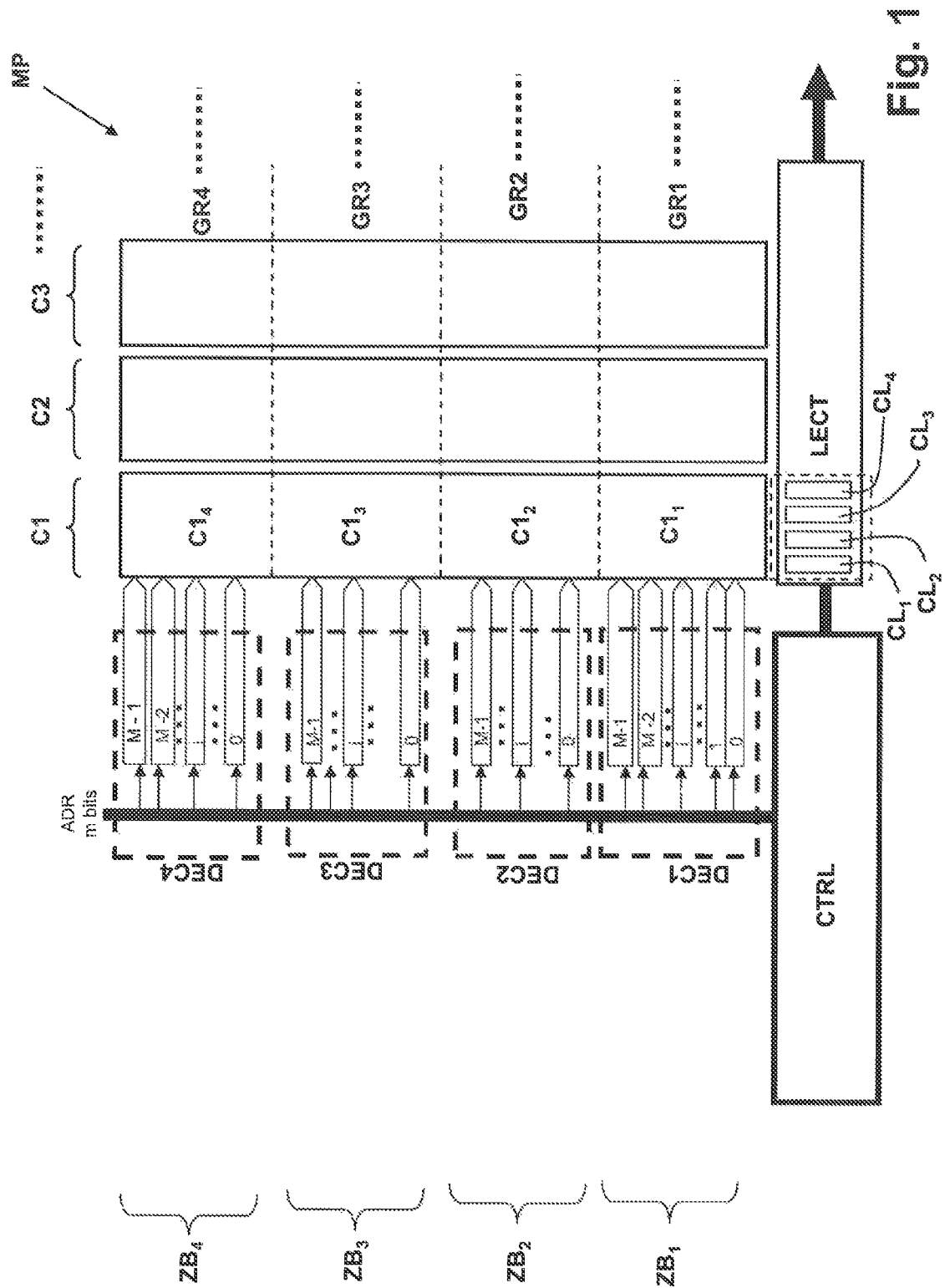
FIG. 1 represents the general architecture of a matrix according to the invention.

FIG. 1 represents the principle of the invention. The matrix of pixels is designated MP. The rows of pixels are evenly distributed between the top and the bottom of the matrix but the matrix is considered to be divided into several groups of rows; the groups are respectively designated GR1, GR2, GR3, GR4. There are X rows in total and it can be considered that there are P groups of M rows (P being greater than or equal to 2). The matrix also consists of Y columns of pixels and adjacent columns C1, C2, C3, etc. have been represented.

Because the matrix is divided into P groups of rows, each column of pixels is divided into P blocks of pixels. The respective blocks of pixels of one and the same column are designated by the references $C1_1$, $C1_2$, $C1_3$, $C1_4$ for the first column.

The matrix is intended to be produced by photorepetition of several patterns; in the example of FIG. 1, it is assumed that the chip comprises successive regions $ZB_1$, $ZB_2$, $ZB_3$ and $ZB_4$ which are strictly identical and produced at each photolithography step with one and the same pattern. The groups of rows GR1 to GR4 respectively form part of the regions $ZB_1$, $ZB_2$, $ZB_3$ and $ZB_4$. The row decoder elements making it possible to select the rows are themselves divided up into groups DEC1 to DEC4 respectively corresponding to the groups of rows and these groups form part of the regions $ZB_1$, $ZB_2$, $ZB_3$ and $ZB_4$ respectively. The groups DEC1 to DEC4 of row decoder elements are all strictly identical. The selection of an address coded on m bits selects one row out of M (row of rank 0 to M-1) in each of the groups of rows; it therefore selects P rows at a time.

The number P of regions identically repeated can typically be between 2 and 10. It is preferably very much less than the number M of the rows of pixels presented in each region $ZB_1$ to $ZB_4$. Hereinafter, P=4 will be taken as an example. The number M can typically be equal to one or several hundred.

A circuitry LECT for reading the signals obtained from the matrix has been represented at the bottom of the matrix. All the control circuits used to make the image sensor operate have also been represented in the form of a rectangle with the reference CTRL. These circuits supply various signals and notably all the signals necessary for the addressing of the rows of the matrix (an address emitted to the row decoders, this address being coded on m bits to designate one row out of M) and possibly the signals necessary for the addressing of the columns (an address coded on y bits to designate one column out of Y).

Usually, the row decoder makes it possible to select one single row out of X, and there is, at the foot of the matrix, a basic read circuit for each column of pixels and a column conductor which links all the pixels of one and the same column to this basic read circuit. Only the pixel corresponding to the selected row supplies a signal to the column conductor intended for the basic read circuit associated with the column.

According to the invention, there are provided at the foot of each column of pixels P basic read circuits $CL_1$, $CL_2$, $CL_3$, $CL_4$ associated with this column. More specifically, each of the P blocks of pixels of one and the same column is linked to a respective basic read circuit. A respective column conductor, not represented in FIG. 1 to avoid cluttering the diagram, is associated with a respective block of pixels and is linked to all the pixels of this block and to the corresponding read circuit but not to the pixels of the other blocks of the column nor to the basic read circuits corresponding to the other blocks.

The general control circuit CTRL may comprise means for selecting one block out of P and this selection consists in the selection of one basic read circuit out of P, and does so in the case where the aim is to extract from the matrix the information item corresponding to a determined pixel at the intersection of a row and a column; in this case, the control circuit CTRL supplies all the row decoder elements with one address out of M (address on m bits), and it at the same time selects one single basic read circuit out of P in the selected column; the P-1 read circuits that are not selected in the selected column remain inactive.

This decoding architecture makes it possible to construct a structure in which the groups of rows GR1, GR2, GR3, GR4 are strictly identical to one another, including in the decoder part DEC1, DEC2, DEC3, DEC4. These groups can therefore be produced by partial photolithography steps by "stitching", with the step-by-step displacement of one and the same mask.

However, even if the matrix structure of X rows and Y columns is not produced by photolithography steps by "stitching", the invention provides another result, namely the possibility of obtaining a more rapid read of the content of the matrix if the P information items corresponding to the P pixels selected simultaneously by the row decoder are output in parallel from the read circuit. In this case, it is not necessary for the control circuits CTRL to comprise means for selecting one basic read circuit out of P.

According to a secondary characteristic of the invention, it is proposed that the geometrical arrangement of the column conductors of a block be exactly identical to the geometrical arrangement of the conductors of the other blocks.

It was found in fact that subdividing the columns into P blocks of pixels connected to P different column conductors would risk creating a fixed image noise resulting from the existence of variable pixel structures in the matrix depending on the position of the pixel in the column, and more specifically depending on whether the pixel belongs to such or such of the P blocks of pixels.

In the arrangement of FIG. 1, it would be possible to imagine that the column conductor (for the column C1) which links the pixels of the block $C1_1$ to the basic read circuit $CL_1$ extends only over the height of the block $C1_1$ and is therefore much shorter than the column conductor which links the pixels of the block $C1_4$ to the read circuit $CL_4$. However, according to the invention, the preference is for the first conductor mentioned to extend as far as the pixels of the block $C1_4$ even if it is not connected to them, to present the same length and the same stray capacitance as the conductor connected to the pixels of the block $C1_4$. Also, the geometrical configuration of these two column conductors is preferably identical to the geometrical configuration of all the column conductors of the matrix.

Preferably, provision is made for the P column conductors to be arranged on two different metallization levels, P-1 conductors extending parallel to one another on one of the levels and a last conductor intersecting the first P-1 on the second level. And provision is also preferably made for the P basic read circuits to be arranged side by side at the foot of a column of pixels (as is represented in FIG. 1 and in FIG. 2).

Figures 2, 3:
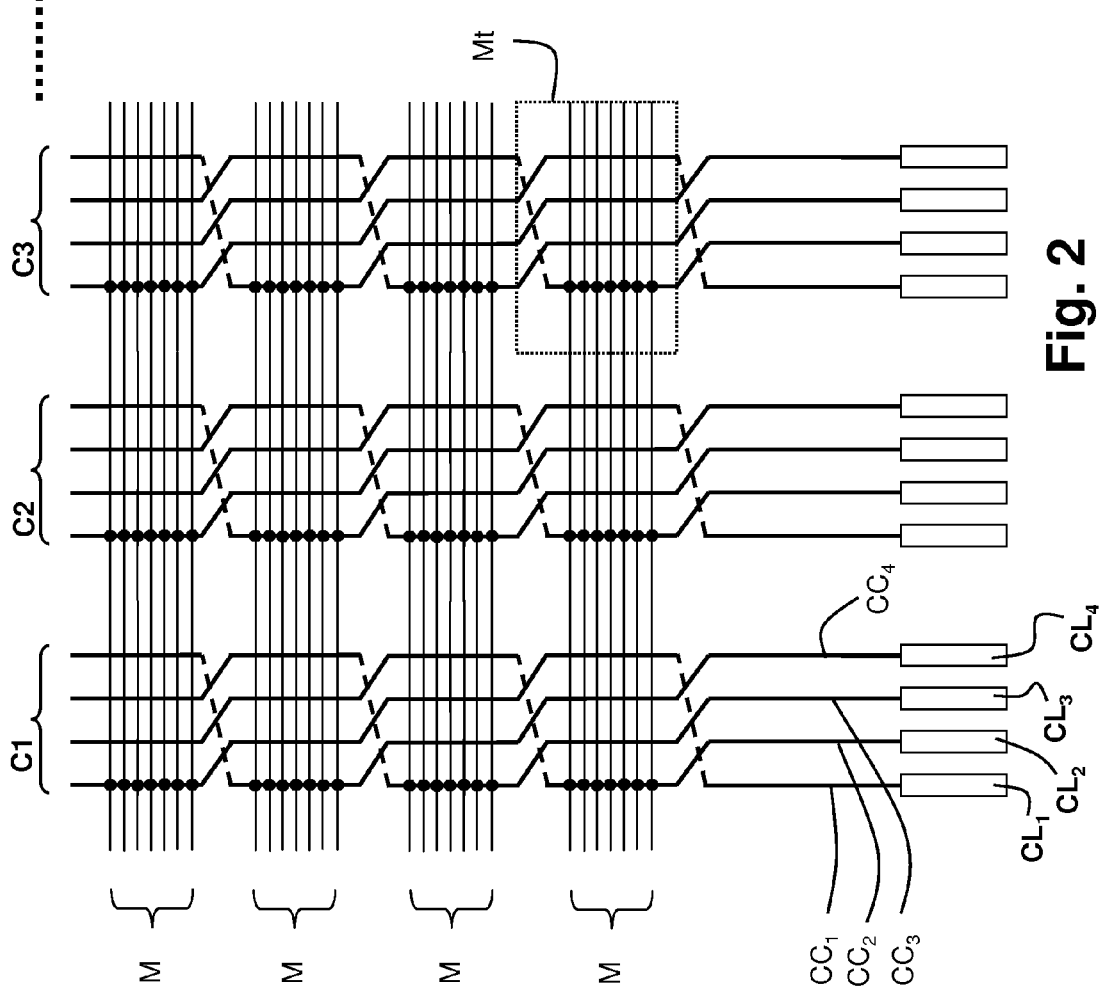
FIG. 2 represents an organization of column conductors suited to the architecture according to the invention.
FIG. 3 represents the practical organization of the connection of the column conductor sections forming part of two adjacent blocks.

FIG. 2 represents a possible arrangement of the column conductors to optimize the evenness of the arrangement of the pixels throughout the matrix, in order to reduce the fixed pattern noise as much as possible.

To avoid cluttering the diagram, the individual pixels situated at the crossroads of a row conductor and a column conductor have not been represented. Only symbolic dots have been represented at each crossroad. Each dot at the intersection of a row and a column represents the pixel which is linked to the respective row conductor (to be selected by this conductor) and which is also linked to the column conductor (to supply to this conductor a signal representing the light). This symbolic representation does not mean that the row conductor is linked to the column conductor. It means only that the pixel is linked to these two conductors.

The symbolic representation of FIG. 2 does not take into account the evenness of distribution of the pixels in rows and columns. In practice, to make the diagram more legible, each of the P blocks of M pixels in a column has been clearly separated from all the others; the columns have also been clearly separated from one another. In reality, the spacing between two pixels of one and the same column is almost the same as the spacing between two pixels of one and the same row, and this applies equally when the two pixels in a column belong to the same block of M and when they belong to two different blocks. Finally, the column conductors are represented with an exaggerated lateral spacing between them to facilitate legibility.

FIG. 2 shows a subdivision of the pixels of the columns into P=4 juxtaposed blocks. The pixels of each block are linked to a respective column conductor $CC_1$ to $CC_4$ which is itself respectively linked to an associated basic read circuit $CL_1$ to $CL_4$.

Each of the P column conductors is produced by the abutting of P conductor sections each belonging to a respective block. Also, each block comprises, for this purpose, P conductor sections intended to produce the column conductors.

A basic pattern of conductor section design is repeated identically for each of the P blocks of pixels of a column, and also identically for the other columns. This pattern is represented in FIG. 2 in a dotted-line box designated by the reference Mt. This pattern is repeated over the P blocks to ensure the production symmetry of the P blocks, whereas from the functional point of view it would not be necessary to prolong all the column conductors right to the top of the matrix since only one of them is connected to the pixels at the top of the matrix.

A preferred way of producing this repeated pattern of column conductors is to provide for, within a repeated pattern, the P conductors to be produced in a first metallization level, apart from one of the P conductors, which includes at least a part produced in a second metallization level so as to be able to intersect the others. In FIG. 2, this part is represented by dashed lines whereas the other conductors are represented by solid lines.

In the preferred configuration, represented in FIG. 2, the repeated pattern of the P conductors used to produce the column conductors $CC_1$ to $CC_4$ is such that the connection of the P conductors of a pattern with the P conductors of an adjacent pattern produces a connection according to a circular permutation. This connection by circular permutation is explained with reference to FIG. 3: if $A_1, A_2, A_3, A_4$ are used to designate the P conductors, of rank 1 to 4, of a pattern, all identical from one pattern to another, the lines of these conductors are such that: the bottom end of the conductor $A_1$ (rank 1) of a pattern Mt$_1$ placed above an adjacent pattern Mt$_2$ comes into contact with the top end of the conductor A$_2$ (rank 2) of the pattern Mt$_2$; the bottom end of the conductor A$_2$ of the top pattern Mt$_1$ comes into contact with the top end of the conductor A$_3$ (rank 3) of the pattern Mt$_2$; and so on by circular permutation, as far as the bottom end of the conductor A$_4$ (rank 4) of the pattern Mt$_1$ which comes into contact with the top end of the conductor A$_l$ (rank 1) of the pattern Mt$_2$.

In this example, it is the conductor A$_1$ of each pattern which includes a part in dashed lines intersecting all the other conductors and produced for this purpose on a different metallic level from the others.

The invention claimed is:

1. An integrated circuit comprising a set of basic circuits, all identical, arranged in X rows and Y columns, each row of basic circuits being addressed by a row conductor linked to a row decoder, wherein each column of basic circuits is subdivided into P blocks, P being greater than 2, of basic circuits, and wherein there are provided, for each column, P juxtaposed basic read circuits, placed at one and the same end of this column and each associated with a respective block, and P column conductors each associated with a respective basic read circuit and a respective block, a column conductor being linked to the associated basic read circuit and to all the basic circuits of the associated block but not to the basic circuits of the other blocks.

2. The integrated circuit as claimed in claim 1, wherein the blocks of basic circuits are juxtaposed between a top and a bottom of the matrix.

3. The integrated circuit as claimed in claim 1, wherein the basic read circuits associated with a column are placed side by side in line.

4. The integrated circuit as claimed in claim 1, wherein each of the P blocks comprises P conductor sections extending between the top and the bottom of the block, the geometrical arrangement of the conductor sections of a block being identical to that of the other blocks, each column conductor comprising P conductor sections which are connected end-to-end and which are each taken in a respective block.

5. The integrated circuit as claimed in claim 1, wherein the P conductor sections of a block are arranged on two different metallization levels, P-1 sections being produced on one of the levels and a last section using the second level to intersect the P-1 first sections.

6. The integrated circuit as claimed in claim 1, wherein the P conductor sections of a block, juxtaposed and arranged in a rank from 1 to P, each comprise a bottom end and a top end positioned so that the bottom end of a section of a given rank situated in a first block comes into contact with the top end of a section of another rank situated in a second block placed above the first block.

7. The integrated circuit as claimed in claim 6, wherein the connection between the conductor sections of two adjacent blocks is made according to a circular permutation of the ranks of the sections, a section of a first rank of a first block coming into contact with a section of a second rank of the other block, and so on.

8. The integrated circuit as claimed in claim 1, wherein the basic circuits of the matrix are photosensitive pixels, the integrated circuit being a matrix image sensor.

9. The integrated circuit as claimed in claim 2, wherein the basic read circuits associated with a column are placed side by side in line.

10. The integrated circuit as claimed in claim 2, wherein each of the P blocks comprises P conductor sections extending between the top and the bottom of the block, the geometrical arrangement of the conductor sections of a block being identical to that of the other blocks, each column conductor comprising P conductor sections which are placed end-to-end and which are each taken in a respective block.

11. The integrated circuit as claimed in claim 3, wherein each of the P blocks comprises P conductor sections extending between the top and the bottom of the block, the geometrical arrangement of the conductor sections of a block being identical to that of the other blocks, each column conductor comprising P conductor sections which are placed end-to-end and which are each taken in a respective block.

12. The integrated circuit as claimed in claim 2, wherein the P conductor sections of a block are arranged on two different metallization levels, P-1 sections being produced on one of the levels and a last section using the second level to intersect the P-1 first sections.

13. The integrated circuit as claimed in claim 3, wherein the P conductor sections of a block are arranged on two different metallization levels, P-1 sections being produced on one of the levels and a last section using the second level to intersect the P-1 first sections.

14. The integrated circuit as claimed in claim 4, wherein the P conductor sections of a block are arranged on two different metallization levels, P-1 sections being produced on one of the levels and a last section using the second level to intersect the P-1 first sections.

15. The integrated circuit as claimed in claim 2, wherein the P conductor sections of a block, juxtaposed and arranged in a rank from 1 to P, each comprise a bottom end and a top end positioned so that the bottom end of a section of a given rank situated in a first block comes into contact with the top end of a section of another rank situated in a second block placed above the first.

16. The integrated circuit as claimed in claim 3, wherein the P conductor sections of a block, juxtaposed and arranged in a rank from 1 to P, each comprise a bottom end and a top end positioned so that the bottom end of a section of a given rank situated in a first block comes into contact with the top end of a section of another rank situated in a second block placed above the first.

17. The integrated circuit as claimed in claim 4, wherein the P conductor sections of a block, juxtaposed and arranged in a rank from 1 to P, each comprise a bottom end and a top end positioned so that the bottom end of a section of a given rank situated in a first block comes into contact with the top end of a section of another rank situated in a second block placed above the first.

18. The integrated circuit as claimed in claim 5, wherein the P conductor sections of a block, juxtaposed and arranged in a rank from 1 to P, each comprise a bottom end and a top end positioned so that the bottom end of a section of a given rank situated in a first block comes into contact with the top end of a section of another rank situated in a second block placed above the first.

19. The integrated circuit as claimed in claim 2, wherein the basic circuits of the matrix are photosensitive pixels, the integrated circuit being a matrix image sensor.

20. The integrated circuit as claimed in claim 3, wherein the basic circuits of the matrix are photosensitive pixels, the integrated circuit being a matrix image sensor.

\* \* \* \* \*